United States Patent
Yang et al.

(10) Patent No.: US 10,897,840 B2
(45) Date of Patent: Jan. 19, 2021

(54) SHIELD BOX, SHIELD BOX ASSEMBLY AND APPARATUS FOR TESTING A SEMICONDUCTOR DEVICE

(71) Applicant: Advanced Semiconductor Engineering Korea, Inc., Paju-Si (KR)

(72) Inventors: Hyun Yang, Paju-Si (KR); Yanghoon Kim, Paju-Si (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 491 days.

(21) Appl. No.: 15/619,411

(22) Filed: Jun. 9, 2017

(65) Prior Publication Data
US 2017/0359925 A1 Dec. 14, 2017

Related U.S. Application Data

(60) Provisional application No. 62/349,366, filed on Jun. 13, 2016.

(51) Int. Cl.
| | |
|---|---|
| *G01R 1/04* | (2006.01) |
| *G01R 1/18* | (2006.01) |
| *G01R 1/24* | (2006.01) |
| *G01R 1/28* | (2006.01) |
| *G01R 31/00* | (2006.01) |
| *G01R 19/00* | (2006.01) |
| *H05K 9/00* | (2006.01) |
| *H05K 5/00* | (2006.01) |

(52) U.S. Cl.
CPC .......... *H05K 9/0015* (2013.01); *G01R 1/0458* (2013.01); *G01R 1/18* (2013.01); *H05K 5/0052* (2013.01)

(58) Field of Classification Search
CPC . G01R 1/04; G01R 1/18; G01R 31/00; G01R 19/00; G01R 1/045; G01R 1/0433; G01R 1/0466; G01R 1/24; G01R 1/28; G01R 1/2834; G01R 1/2889; G01R 31/02; G01R 31/26; G01R 31/28; G01R 31/303; G01R 31/31905; H05K 9/00; H05K 5/00
See application file for complete search history.

(56) References Cited

U.S. PATENT DOCUMENTS

| | | | |
|---|---|---|---|
| 5,594,200 A | 1/1997 | Ramsey | |
| 5,876,326 A * | 3/1999 | Takamura | A61B 1/00124 600/110 |

(Continued)

FOREIGN PATENT DOCUMENTS

| | | |
|---|---|---|
| JP | H05-209931 A | 8/1993 |
| JP | 2004-055612 A | 2/2004 |

*Primary Examiner* — Neel D Shah
(74) *Attorney, Agent, or Firm* — Foley & Lardner LLP

(57) ABSTRACT

A shield box includes a top portion, a bottom portion and a socket. The top portion defines an aperture and includes at least one first ridge and at least one first groove. The bottom portion includes at least one second ridge and at least one second groove. The first ridge of the top portion occupies a second space defined by the second groove of the bottom portion, and the second ridge of the bottom portion occupies a first space defined by the first groove of the top portion. The socket is disposed over the bottom portion and accessible through the aperture of the top portion.

19 Claims, 6 Drawing Sheets

(56) References Cited

U.S. PATENT DOCUMENTS

| | | | | |
|---|---|---|---|---|
| 6,104,204 A | * | 8/2000 | Hayama | G01R 1/0458 |
| | | | | 324/750.08 |
| 7,839,136 B1 | * | 11/2010 | John | G01R 29/0835 |
| | | | | 324/627 |
| 2006/0022664 A1 | * | 2/2006 | Hill | G01R 1/18 |
| | | | | 324/750.27 |
| 2009/0051366 A1 | * | 2/2009 | Miyauchi | G01R 31/2822 |
| | | | | 324/537 |
| 2010/0283476 A1 | * | 11/2010 | Shen | G01R 1/0466 |
| | | | | 324/537 |
| 2011/0080187 A1 | * | 4/2011 | Hotz | G01R 31/2889 |
| | | | | 324/756.02 |
| 2017/0160310 A1 | * | 6/2017 | Isaac | G01R 1/045 |
| 2017/0317429 A1 | * | 11/2017 | Roan | H01R 4/023 |

\* cited by examiner

SHIELD BOX, SHIELD BOX ASSEMBLY AND APPARATUS FOR TESTING A SEMICONDUCTOR DEVICE

CROSS-REFERENCE TO RELATED APPLICATIONS

This application claims the benefit of and priority to U.S. Provisional Patent Application 62/349,366, filed Jun. 13, 2016, which is incorporated herein by reference in its entirety.

BACKGROUND

1. Field of the Disclosure

The present disclosure relates to a shield box, a shield box assembly and an apparatus for testing a semiconductor device, and more particularly, to a shield box and a shield box assembly that can isolate the semiconductor device under testing from external noises (e.g., radio-frequency (RF) noise or electromagnetic interference (EMI) noise) and a testing apparatus including the same.

2. Description of the Related Art

When measuring or testing the semiconductor device by a test socket, the influence of an external noise may lower the accuracy of the measurement or test. A method measures or tests the semiconductor device in a shielding room, which occupies a large space and is costly. It is therefore desirable to develop an apparatus to overcome the above problem. The present disclosure would provide a reliable way of measuring or testing the semiconductor device without occupying the large space.

SUMMARY

In one aspect according to some embodiments, a shield box includes a top portion, a bottom portion and a socket. The top portion defines an aperture and includes at least one first ridge and at least one first groove. The bottom portion includes at least one second ridge and at least one second groove. The first ridge of the top portion occupies a second space defined by the second groove of the bottom portion, and the second ridge of the bottom portion occupies a first space defined by the first groove of the top portion. The socket is disposed over the bottom portion and accessible through the aperture of the top portion.

In another aspect according to some embodiments, a shield box assembly includes a shield box and a work press. The shield box includes a top portion, a bottom portion and a socket. The top portion has an upper side and a lower side opposite to the upper side. The top portion defines an aperture, and includes at least one third ridge and at least one third groove around the aperture. The aperture, the at least one third ridge and the at least one third groove are disposed on the upper side of the top portion. The bottom portion includes an upper side configured to mechanically mate with the lower side of the top portion. The socket is disposed over the bottom portion and accessible through the aperture of the top portion. The work press includes at least one fourth ridge and at least one fourth groove. The fourth ridge of the work press occupies at least a portion of a third space defined by the third groove of the top portion, and the third ridge of the top portion occupies at least a portion of a fourth space defined by the fourth groove of the work press.

In another aspect according to some embodiments, an apparatus for testing a semiconductor device includes a shielding curtain, a shield box, a work press, a signal source and a signal receiver. The shield box is disposed in a space enclosed by the shielding curtain, and includes a top portion, a bottom portion, a test board and a socket. The top portion defines an aperture and includes at least one first ridge and at least one first groove on a lower side of the top portion. The bottom portion includes at least one second ridge and at least one second groove. The first ridge of the top portion corresponds to the second groove of the bottom portion, and the first groove of the top portion corresponds to the second ridge of the bottom portion. The test board is interposed between the top portion and the bottom portion. The socket is mounted on the test board for receiving the semiconductor device accessible through the aperture of the top portion. The work press includes at least one protrusion portion corresponding to the aperture. The signal source is configured to emit a test signal to the semiconductor device. The signal receiver is configured to receive a result signal from the semiconductor device.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

In semiconductor manufacturing, it is often desirable to test a semiconductor device during various stages of manufacture for reception or transmission characteristics, such as reception or transmission characteristics in a radio frequency (RF) spectrum. Testing may additionally or alternatively be performed using defined test protocols to assess susceptibility of the semiconductor device to electromagnetic interference (EMI) or generation of EMI by the semiconductor device. However, ambient RF or EMI noise (referring to RF and EMI signals that are not part of a test) can affect test results, often randomly. The ambient RF or EMI noise may be different at different locations. Thus, to perform the testing without the interference of ambient RF or EMI noise, the semiconductor device may be transported to a test chamber for testing and subsequently returned to the manufacturing floor for a next stage of manufacturing. Test chambers are often room-sized enclosures built of special materials to isolate the test subject device from ambient RF and EMI noises. The removal of the semiconductor device from the test floor for testing into a test chamber can take time and introduce additional cost into production. Further, a size and an expense of a test chamber may be prohibitive to maintain a sufficient number of test chambers. There may be a backlog of test subject semiconductor devices waiting for testing using a few available test chambers.

According to at least some embodiments of the present disclosure, a portable shield box provides RF and EMI isolation similar that provided by a test chamber. Because the shield box isolates a subject semiconductor device from ambient RF or EMI noise, the shield box may be moved between locations along a manufacturing line, or may be moved between manufacturing lines, without significantly affecting test results. In addition, the testing apparatus including the shield box does not occupy a large space as a shielding room does.

Figure 1:
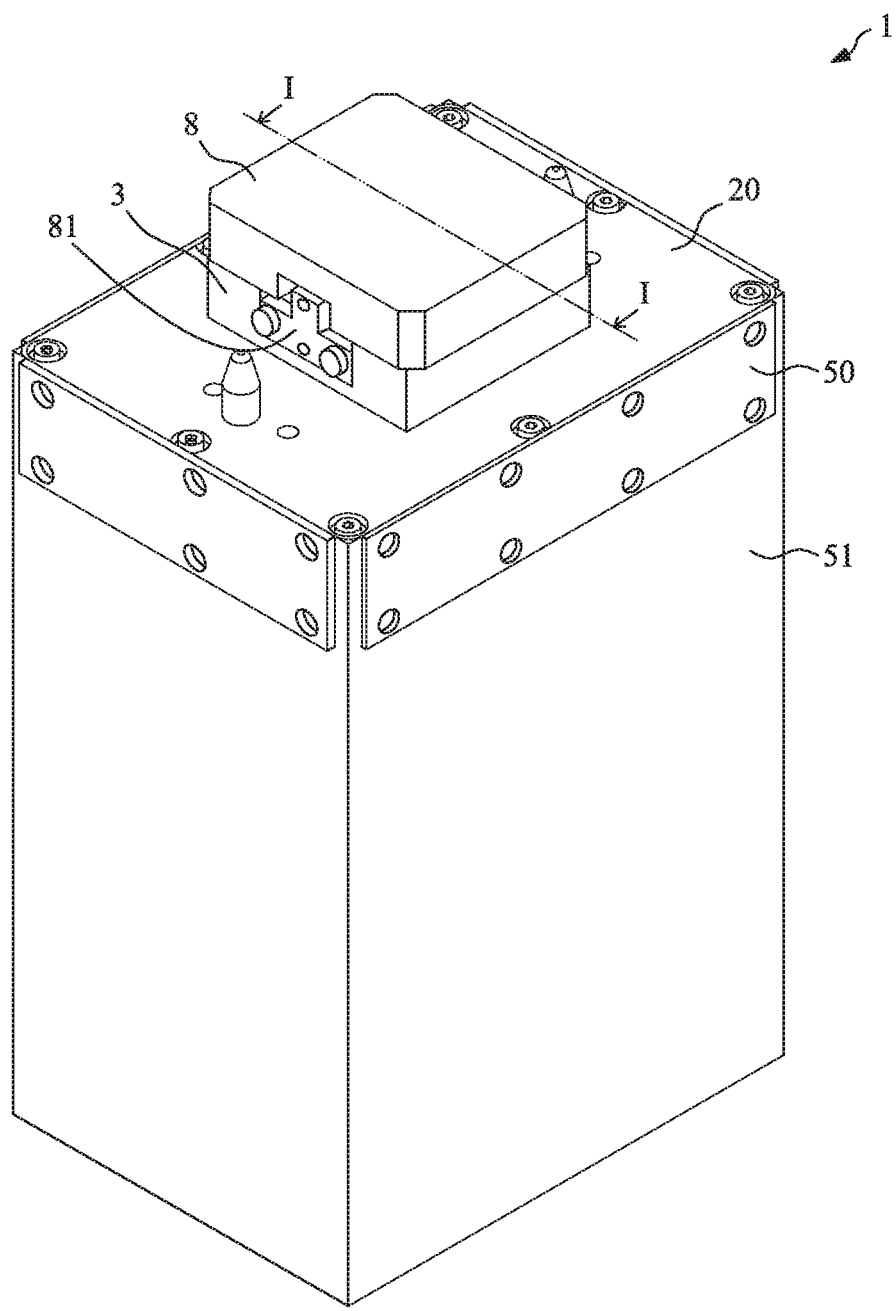
FIG. 1 illustrates a perspective view of an apparatus for testing a semiconductor device according to some embodiments of the present disclosure.
Figure 2:
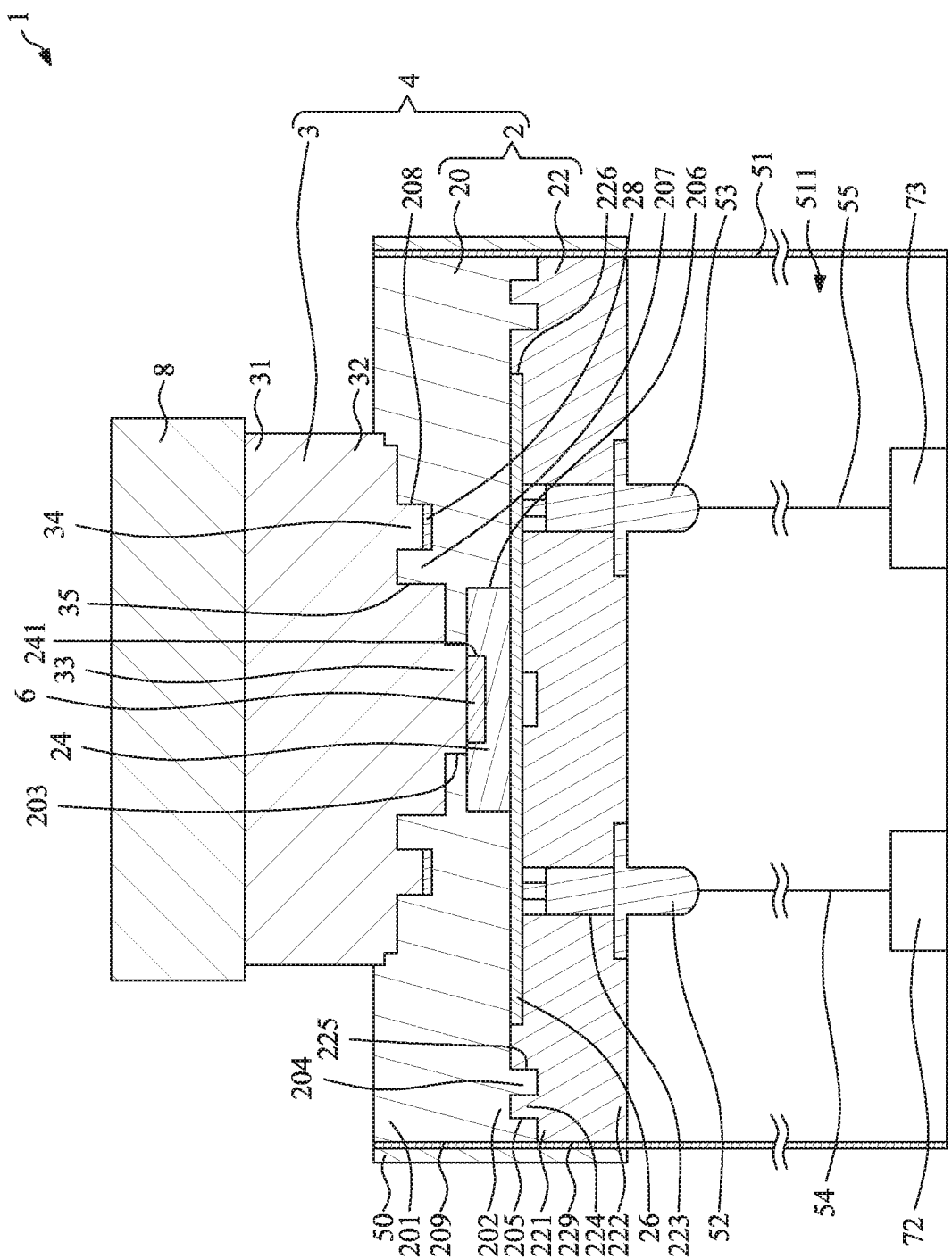
FIG. 2 illustrates a cross-sectional view taken along I-I of the apparatus of FIG. 1 according to some embodiments of the present disclosure.

FIG. 1 illustrates a perspective view of an apparatus 1 for testing a semiconductor device 6 according to some embodiments of the present disclosure. FIG. 2 illustrates a cross-sectional view taken along I-I of the apparatus 1 of FIG. 1. As shown in FIG. 2, the apparatus 1 includes a shielding curtain 51, a plurality of side covers 50, a shield box assembly 4 (including a shield box 2 and a work press 3), a signal source 72, a signal receiver 73 and a handle part 8. The shielding curtain 51 may be, e.g., a thin and flexible plate or fabric, and the material of the shielding curtain 51 may include, e.g., metal and/or plastic material. A surface of a top portion of the shielding curtain 51 is attached to and covers periphery surfaces of the shield box 2 so as to define an inner space 511. In other words, the shield box 2 is disposed in the inner space 511 enclosed by the shielding curtain 51. The shielding curtain 51 can prevent the signal inside the inner space 511 from being transmitted to the outside (e.g., the ambient space) of the inner space 511, and can prevent the signal outside of the inner space 511 (e.g., signal from the ambient space) from entering into the inner space 511.

The shield box assembly 4 includes the shield box 2 and the work press 3. In one or more embodiments, the shield box 2 may include a top portion 20, a bottom portion 22, a test board 26 and a socket 24. In some embodiments, the material of the top portion 20 may be the same as the material of the bottom portion 22. The top portion 20 and/or the bottom portion 22 can include metal such as copper, silver, brass, or a combination of two or more thereof.

The top portion 20 of the shield box 2 includes an upper side 201, a lower side 202, at least one first ridge 204, at least one first groove 205, at least one third ridge 207, at least one third groove 208 and a plurality of side surfaces 209. The lower side 202 is opposite to the upper side 201. In some embodiments, the top portion 20 may define an aperture 203 and an accommodating space 206. The first ridge 204 and the first groove 205 are disposed on the lower side 202 of the top portion 20. In some embodiments, the first ridge 204 and the first groove 205 are in concentric shapes (e.g., concentric ring shapes) from a bottom view, and surround the aperture 203 and the accommodating space 206. A side surface of the first ridge 204 may form at least a portion of a sidewall of the adjacent first groove 205 so that a portion of the bottom surface of the top portion 20 may be in a saw tooth wave shape as shown in the cross-sectional view of FIG. 2. In embodiments as shown in FIG. 2, the top portion 20 has one first ridge 204 and one first groove 205, however, it is noted that the number of the first ridge 204 and the first groove 205 may be greater than or equal to two.

The third ridge 207 and the third groove 208 are disposed on the upper side 201 of the top portion 20. In some embodiments, the third ridge 207 and the third groove 208 are in concentric shapes (e.g., concentric ring shapes) from a top view, and surround the aperture 203 and the accommodating space 206. A side surface of the third ridge 207 may form at least a portion of a sidewall of the adjacent third groove 208 so that a portion of the top surface of the top portion 20 may be in a saw tooth wave shape as shown in the cross-sectional view of FIG. 2. In embodiments as shown in FIG. 2, the top portion 20 has one third ridge 207 and one third groove 208, however, it is noted that the number of the third ridge 207 and the third groove 208 may be greater than or equal to two.

The accommodating space 206 is configured to accommodate the socket 24. The accommodating space 206 is in communication with the aperture 203. Thus, when the semiconductor device 6 is disposed in the socket 24, the semiconductor device 6 and the socket 24 are accessible through the aperture 203 from the upper side 201. In some embodiments, the socket 24 may define a receiving opening 241 for receiving the semiconductor device 6, and a depth of the receiving opening 241 may be substantially equal to a height of the semiconductor device 6. Further, a depth of the accommodating space 206 may be substantially equal to a height of the socket 24. As shown in FIG. 2, the first ridge 204, the first groove 205, the third ridge 207 and the third groove 208 surround the socket 24 and the semiconductor device 6.

The bottom portion 22 includes an upper side 221, a lower side 222, at least one second ridge 224, at least one second groove 225 and a plurality of side surfaces 209. The lower side 222 is opposite to the upper side 221. In some embodiments, the bottom portion 22 may further define a recess portion 226 and a plurality of through holes 223. The first ridge 204 of the top portion 20 corresponds to the second groove 225 of the bottom portion 22, and the first groove 205 of the top portion 20 corresponds to the second ridge 224 of the bottom portion 22.

The second ridge 224 and the second groove 225 are disposed on the upper side 221 of the bottom portion 22. In some embodiments, the second ridge 224 and the second groove 225 are in concentric shapes (e.g., concentric ring shapes) from a top view, and surround the recess portion 226. A side surface of the second ridge 224 may form at least a portion of a sidewall of the adjacent second groove 225 so that a portion of the top surface of the bottom portion 22 may be in a saw tooth wave shape as shown in the cross-sectional view of FIG. 2. In embodiments as shown in FIG. 2, the bottom portion 22 has one second ridge 224 and one second groove 225, however, it is noted that the number of the second ridge 224 and the second groove 225 may be greater than or equal to two.

The upper side 221 of the bottom portion 22 is configured to mechanically mate with the lower side 202 of the top portion 20. The first ridge 204 of the top portion 20 is aligned with and positioned in the second groove 225 of the bottom portion 22, and the second ridge 224 of the bottom portion 22 is aligned with and positioned in the first groove 205 of the top portion 20. In some embodiments, a size of the first ridge 204 of the top portion 20 fits a size of the second groove 225 of the bottom portion 22, and a size of the first groove 205 of the top portion 20 fits a size of the second ridge 224 of the bottom portion 22. Thus, the first ridge 204 of the top portion 20 occupies at least a portion of a second space defined by the second groove 225 of the bottom portion 22. The second ridge 224 of the bottom portion 22 occupies at least a portion of a first space defined by the first groove 205 of the top portion 20.

The recess portion 226 is disposed on the upper side 221 of the bottom portion 22, and is configured to accommodate the test board 26. The recess portion 226 is in communication with the through holes 223 extending through the bottom portion 22. Thus, when the test board 26 is disposed on the bottom portion 22, the bottom surface of the test board 26 is accessible through the through holes 223 from the lower side 222 of the bottom portion 22. The socket 24 is mounted on the test board 26 so that the socket 24 is disposed over the bottom portion 22. As shown in FIG. 2, the test board 26 is interposed between the lower side 202 of the top portion 20 and the upper side 221 of the bottom portion 22. A depth of the recess portion 226 may be substantially equal to a thickness of the test board 26. As shown in FIG. 2, the second ridge 224 and the second groove 225 surround the test board 26, the socket 24 and the semiconductor device 6.

The side covers 50 of the apparatus 1 cover the side surfaces 209 of the top portion 20 and the side surfaces 229 of the bottom portion 22. Thus, the side covers 50 cover the seams on the periphery surfaces of the shield box 2 formed between the top portion 20 and the bottom portion 22. Each of the side covers 50 may be a metal sheet, and may be secured to a corresponding one of the side surfaces 209 of the top portion 20 and/or a corresponding one of the side surfaces 229 of the bottom portion 22. As shown in FIG. 2, at least a portion of the shielding curtain 51 is interposed between the side covers 50 and the side surfaces 209 of the top portion 20 and the side surfaces 229 of the bottom portion 22. That is, portions of the shielding curtain 51 cover the side surfaces 209 of the top portion 20 and the side surfaces 229 of the bottom portion 22. Further, the side covers 50 cover the portions of the shielding curtain 51 on the side surfaces 209 of the top portion 20 and the side surfaces 229 of the bottom portion 22 by, for example, screwing them together.

The work press 3 contacts and presses against the top portion 20 of the shield box 2. The work press 3 includes an upper side 31, a lower side 32, a protrusion portion 33, at least one fourth ridge 34 and at least one fourth groove 35. The lower side 32 is opposite to the upper side 31. The protrusion portion 33 is substantially disposed at the center of the lower side 32 of the work press 3, and corresponds to the aperture 203 of the top portion 20 of the shield box 2.

The fourth ridge 34 and the fourth groove 35 are disposed on the lower side 32 of the work press 3. In some embodiments, the fourth ridge 34 and the fourth groove 35 are in concentric shapes (e.g., concentric ring shapes) from a bottom view, and surround the protrusion portion 33. Thus, the fourth ridge 34 and the fourth groove 35 may also surround the aperture 203 of the top portion 20 of the shield box 2 and the socket 24. A side surface of the fourth ridge 34 may form at least a portion of a sidewall of the adjacent fourth groove 35 so that a portion of the bottom surface of the work press 3 may be in a saw tooth wave shape as shown in the cross-sectional view of FIG. 2. In embodiments as shown in FIG. 2, the work press 3 has one fourth ridge 34 and one fourth groove 35, however, it is noted that the number of the fourth ridge 34 and the fourth groove 35 may be greater than or equal to two.

The lower side 32 of the work press 3 is configured to mechanically mate with the upper side 201 of the top portion 20 of the shield box 2. The fourth ridge 34 of the work press 3 is aligned with and positioned in the third groove 208 of the top portion 20 of the shield box 2, and the third ridge 207 of the top portion 20 of the shield box 2 is aligned with and positioned in the fourth groove 35 of the work press 3. The protrusion portion 33 of the work press 3 is aligned with and positioned in the aperture 203 of the top portion 20 of the shield box 2 to contact the socket 24 and/or the semiconductor device 6. In some embodiments, a size of the fourth ridge 34 of the work press 3 fits a size of the third groove 208 of the top portion 20 of the shield box 2, a size of the fourth groove 35 of the work press 3 fits a size of the third ridge 207 of the top portion 20 of the shield box 2, and a size of the protrusion portion 33 of the work press 3 fits a size of the aperture 203 of the top portion 20 of the shield box 2. In other words, the fourth ridge 34 of the work press 3 occupies at least a portion of a third space defined by the third groove 208 of the top portion 20 of the shield box 2. The third ridge 207 of the top portion 20 of the shield box 2 occupies at least a portion of a fourth space defined by the fourth groove 35 of the work press 3. The protrusion portion 33 of the work press 3 occupies at least a portion of the aperture 203 of the top portion 20 of the shield box 2.

A height of the protrusion portion 33 of the work press 3 may be substantially equal to a depth of the aperture 203 of the top portion 20 of the shield box 2.

The handle part 8 may be used to press the work press 3. In some embodiments, there may be clamping parts 81 (as shown in FIG. 1) for clamping the handle part 8 and the work press 3 so that the handle part 8 is attached to the work press 3 securely.

In some embodiments, the shield box 2 may include an absorber 28 (one or more) positioned in the third groove 208 of the top portion 20 of the shield box 2. In other words, the absorber 28 is positioned around the aperture of the top portion 20 of the shield box 2, the socket 24 and/or the semiconductor device 6. As shown in FIG. 2, the absorber 28 is interposed between the fourth ridge 34 of the work press 3 and the third groove 208 of the top portion 20 of the shield box 2. The absorber 28 may be a gasket for absorbing RF noise, EMI noise and/or shock force. The material of the absorber 28 may be metal (e.g., steel) or plastic, and the absorber 28 may be flexible. The thickness of the absorber 28 may be less than the depth of the third groove 208 of the top portion 20 of the shield box 2. The absorber 28 may be in a ring shape, or may include multiple (e.g., four) strips.

In some embodiments, the shield box 2 may further include at least one first coaxial adaptor 52 (e.g., a coaxial RF adaptor such as an SMA (SubMiniature version A) connector) and at least one second coaxial adaptor 53 (e.g., a coaxial RF adaptor such as an SMA connector). The apparatus 1 may further include at least one first connecting wire 54, at least one second connecting wire 55, the signal source 72 and the signal receiver 73. The first coaxial adaptor 52 and the second coaxial adaptor 53 are positioned on the lower side 222 of the bottom portion 22 of the shield box 2. At least portions of the first coaxial adaptor 52 and the second coaxial adaptor 53 are disposed in the through holes 223 of the bottom portion 22 so that the first coaxial adaptor 52 and the second coaxial adaptor 53 are electrically connected to the bottom surface of the test board 26. In addition, the first coaxial adaptor 52 is electrically connected to the signal source 72 through the first connecting wire 54, and the second coaxial adaptor 53 is electrically connected to the signal receiver 73 through the second connecting wire 55.

Therefore, the signal source 72 is electrically connected to the semiconductor device 6, and the signal source 72 is configured to emit a test signal to the semiconductor device 6 through the first connecting wire 54, the first coaxial adaptor 52 and the layout of the test board 26. The signal receiver 74 is electrically connected to the semiconductor device 6, and the signal receiver 74 is configured to receive a result signal from the semiconductor device 6 through the layout of the test board 26, the second coaxial adaptor 53 and the second connecting wire 55. In some embodiments, the signal source 72 and the signal receiver 73 are disposed in the inner space 511 enclosed by the shielding curtain 51.

Figure 3:
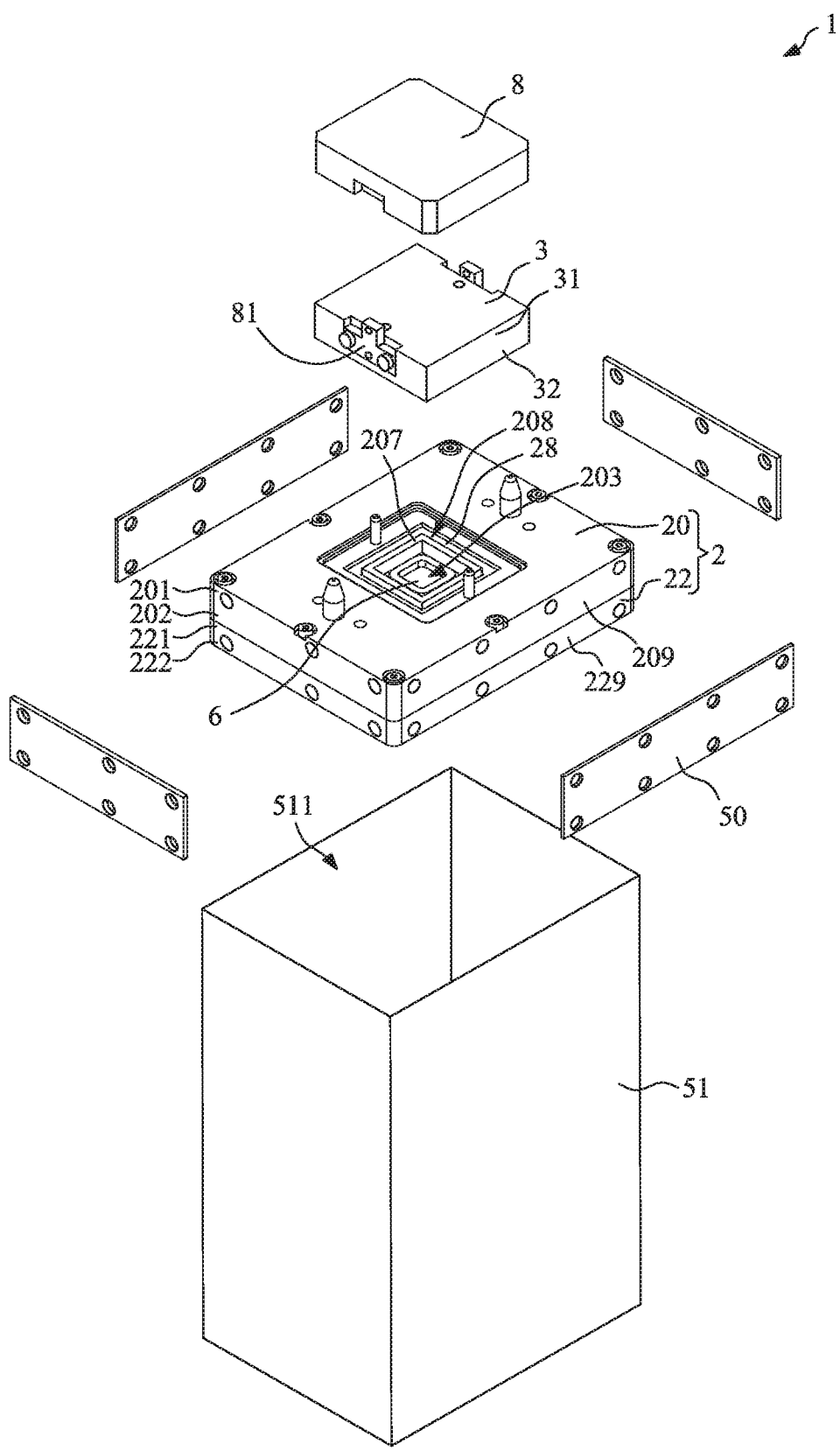
FIG. 3 illustrates an exploded view of the apparatus of FIG. 1 according to some embodiments of the present disclosure.

FIG. 3 illustrates an exploded view of the apparatus 1 of FIG. 1. As shown in FIG. 3, in the shield box 2, the third ridge 207 and the third groove 208 are in concentric shapes (e.g., concentric ring shapes) from a top view, and surround the aperture 203 and the semiconductor device 6. A size of the top portion 20 from a top view is substantially equal to a size of the bottom portion 22 from the top view. Thus, the four side surfaces 209 of the top portion 20 are substantially coplanar with the four side surfaces 229 of the bottom portion 22 so as to form the periphery surfaces of the shield box 2. Therefore, the shielding curtain 51 and the side covers 50 cover the side surfaces 209 of the top portion 20 and the side surfaces 229 of the bottom portion 22, and the seams on the periphery surfaces of the shield box 2 formed between the top portion 20 and the bottom portion 22.

Figure 4:
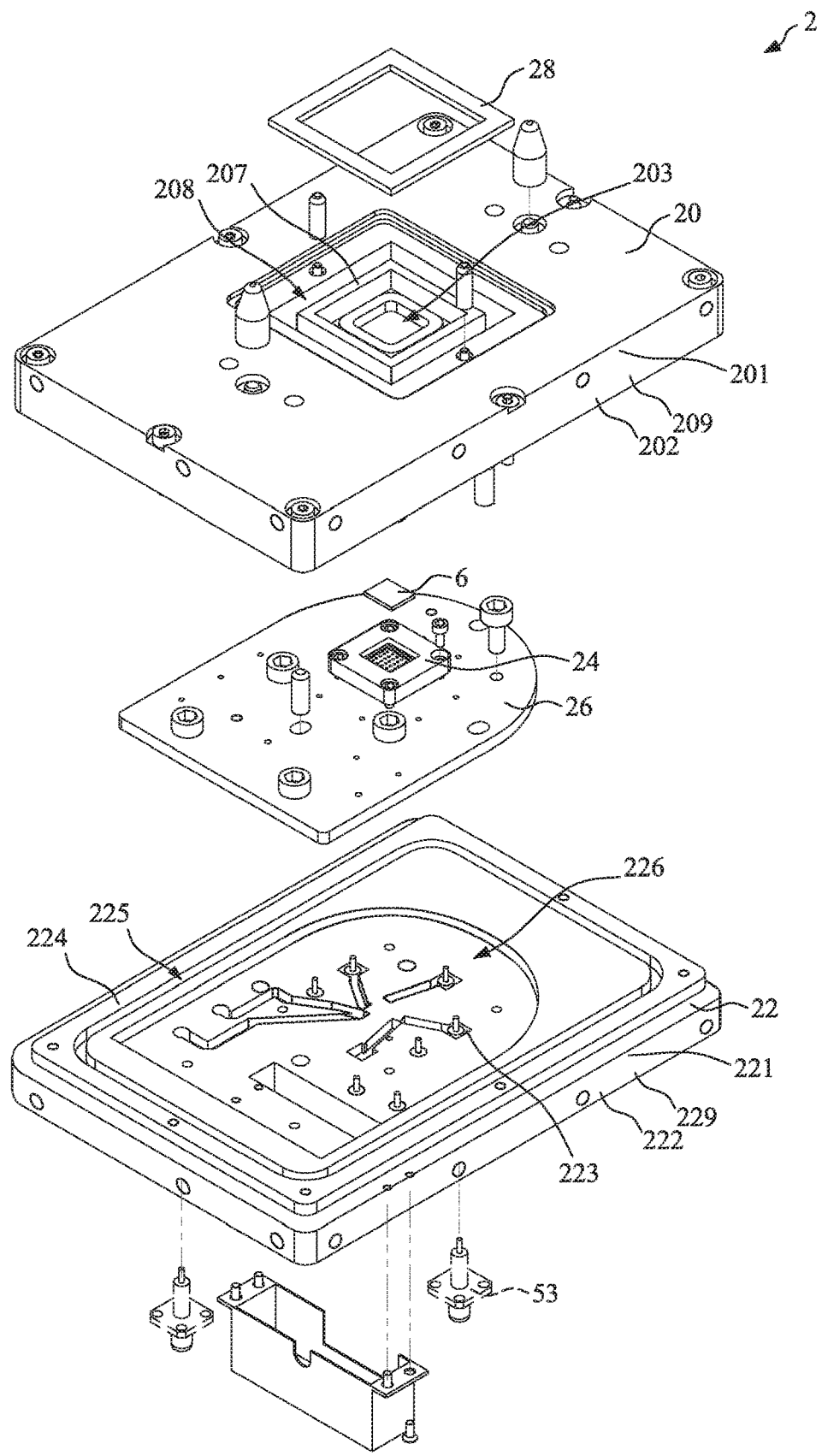
FIG. 4 illustrates an exploded view of a shield box of FIG. 3 according to some embodiments of the present disclosure.

FIG. 4 illustrates an exploded view of the shield box 2 of FIG. 3. The second ridge 224 and the second groove 225 of the bottom portion 22 are in concentric shapes (e.g., concentric ring shapes) from a top view, and surround the recess portion 226. The shape of the test board 26 from a top view may be substantially the same as the shape of the recess portion 226 from a top view. The through holes 223, the first coaxial adaptor 52 and the second coaxial adaptor 53 may be disposed at positions corresponding to the layout of the test board 26.

Figure 5:
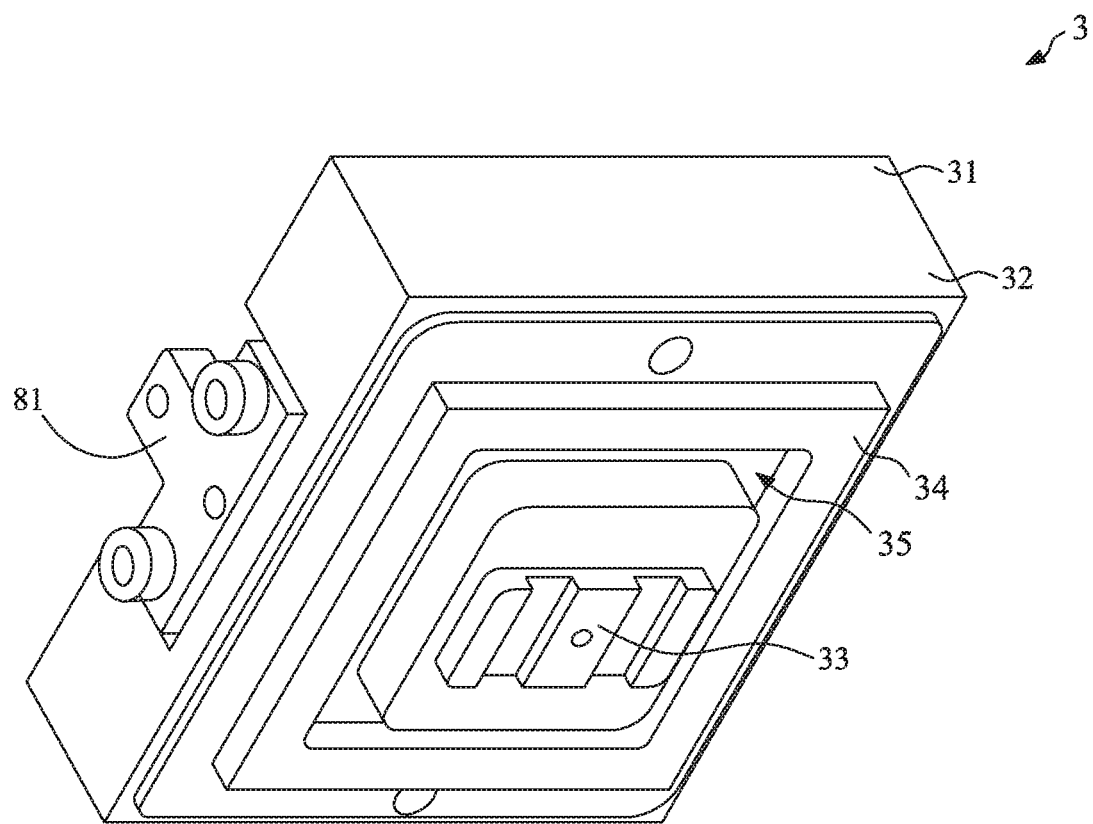
FIG. 5 illustrates a bottom perspective view of a work press of FIG. 3 according to some embodiments of the present disclosure.

FIG. 5 illustrates a bottom perspective view of the work press 3 of FIG. 3. As shown in FIG. 5, the work press 3 has one fourth ridge 34 and one fourth groove 35, and the fourth ridge 34 and the fourth groove 35 are in concentric shapes (e.g., concentric ring shapes) from a bottom view, and surround the protrusion portion 33.

Figure 6:
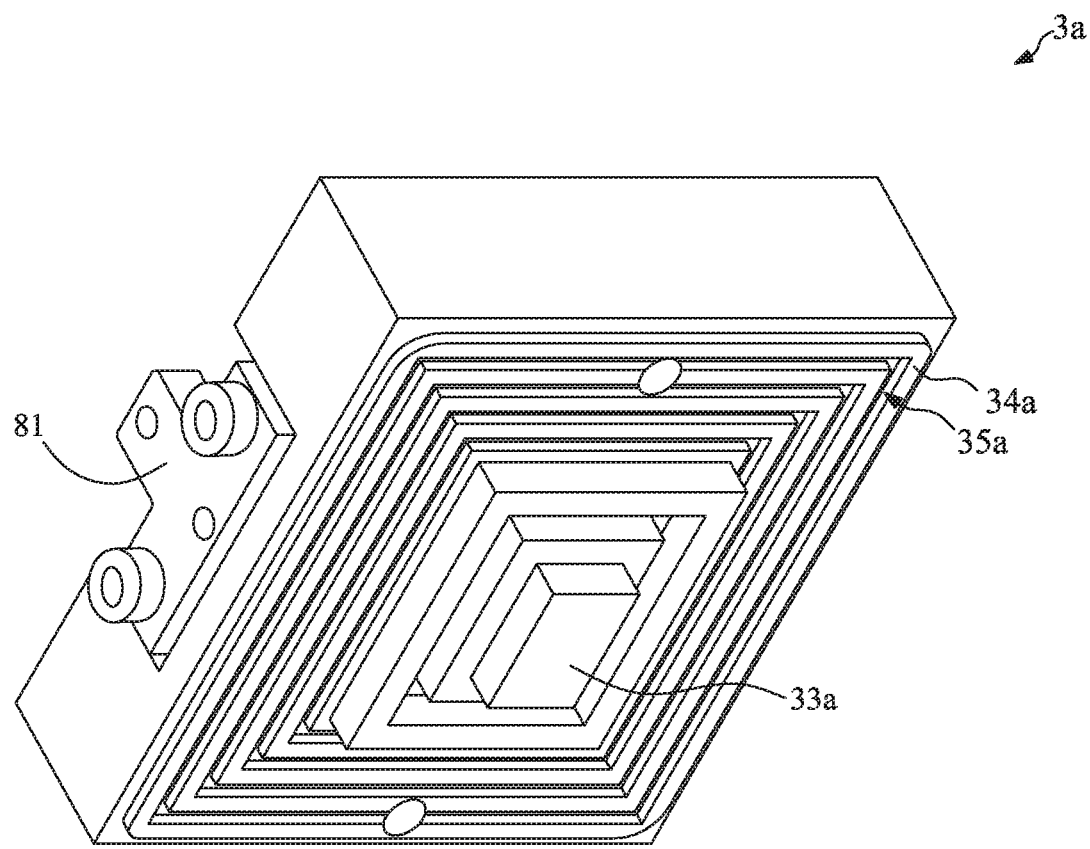
FIG. 6 illustrates a bottom perspective view of a work press according to some embodiments of the present disclosure.

In some embodiments, a work press may include multiple ridges and multiple grooves that in concentric shapes. FIG. 6 illustrates a bottom perspective view of a work press 3a according to some embodiments of the present disclosure. As shown in FIG. 6, the work press 3a has four fourth ridges 34a and four fourth grooves 35a, and the fourth ridges 34 and the fourth grooves 35 are in concentric shapes (e.g., concentric ring shapes) from a bottom view, and surround the protrusion portion 33a.

Referring back to FIG. 2, a first gap (also referred to as first path) may be formed between the top portion 20 of the shield box 2 and the bottom portion 22 of the shield box 2, and a second gap (also referred to as second path) may be formed between the top portion 20 of the shield box 2 and the work press 3. The first gap and the second gap may be paths through which the ambient noise (referring to signals that are not part of a test, such as ambient RF noise, ambient EMI noise, cell phone signals, Bluetooth signals, Wi-Fi signals, etc.) can propagate into the accommodating space 206. The ambient noise, through the first gap and/or the second gap, can reach the socket 24 and the semiconductor device 6 in the accommodating space 206 to affect test results adversely. In addition, the ambient noise may also directly influence the first coaxial adaptor 52, the second coaxial adaptor 53, the first connecting wire 54, the second connecting wire 55, the signal source 72 and the signal receiver 73, which may also affect test results adversely. Similarly, the internal signals (e.g., test frequency for the testing process) might propagate to the ambient space outside of the apparatus 1 through, e.g., the first gap, the second gap, the first coaxial adaptor 52 and the second coaxial adaptor 53.

To address such concerns, according to at least some embodiments of present disclosure, referring to FIG. 2, the shielding curtain 51 and the side covers 50 can prevent the signal inside the inner space 511 from being transmitted to the outside (e.g., the ambient space) of the inner space 511, and can prevent the signal outside of the inner space 511 (e.g., ambient noise in the ambient space) from entering into the inside of the inner space 511. In addition, the first gap between the top portion 20 of the shield box 2 and the bottom portion 22 of the shield box 2 may be narrow and serpentine due to the contacts and engagements between the first ridge 204 of the top portion 20 of the shield box 2 and the second groove 225 of the bottom portion 22 of the shield box 2, and the second ridge 224 of the bottom portion 22 and the first groove 205 of the top portion 20. Similarly, the second gap between the top portion 20 of the shield box 2 and the work press 3 may be narrow and serpentine due to the contacts and engagements between the fourth ridge 34 of the work press 3 and the third groove 208 of the top portion 20 of the shield box 2, the third ridge 207 of the top portion 20 of the shield box 2 and the fourth groove 35 of the work press 3, and the protrusion portion 33 of the work press 3 and the aperture 203 of the top portion 20 of the shield box 2. Thus, ambient noise entering the first path and/or the second path are reflected multiple times and therefore are attenuated or even blocked, before the ambient noise reaching the socket 24 and/or the semiconductor device 6 in the accommodating space 206. Similarly, a signal from the inner space 511 entering the first path and/or the second path are reflected multiple times and therefore are attenuated or even blocked, before the signal being transmitted to the ambient space outside of the apparatus 1.

Therefore, during a testing process for testing the semiconductor device 6, the serpentine first path and second path, and the coverages of the shielding curtain 51 and the side covers 50 can prevent the ambient noise from affecting test results adversely. Further, the signal inside the inner space 511 can be prevented from being transmitted to outside (e.g., the ambient space) of the inner space 511. As a result, an accurate test result may be achieved.

As shown in FIG. 2, because the shield box 2 can isolate the semiconductor device 6 from interference of ambient noise, the shield box 2 may be moved between locations along a manufacturing line, or may be moved between manufacturing lines, without significantly affecting test results. In addition, the testing apparatus 1 including the shield box 2 does not occupy a large space as a shielding room does. In some embodiments, more than two testing apparatuses 1 may be disposed side by side in a test chamber since two adjacent testing apparatuses 1 do not affect each other.

In some embodiments, noise measurement is made within the shield box 2, and a difference between a maximum peak value and a minimum value, shown in decibels (dB), is measured to be about 0.113 dB. By way of comparison, an ambient noise level in a test laboratory is measured as more than 30 dB for a difference between a maximum peak value and a minimum value.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

In the description of some embodiments, a component provided "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A shield box, comprising: a top portion defining an aperture and including at least one first ridge and at least one first groove; a bottom portion including at least one second ridge and at least one second groove, wherein the first ridge of the top portion occupies a second space defined by the second groove of the bottom portion, and the second ridge of the bottom portion occupies a first space defined by the first groove of the top portion; a socket disposed over the bottom portion and accessible through the aperture of the top portion; and a work press including at least one protrusion portion corresponding to the aperture; wherein the top portion contacts the socket, and the top portion further includes at least one third ridge and at least one third groove on an upper side of the top portion, the work press further includes at least one fourth ridge and at least one fourth groove, wherein the fourth ridge of the work press corresponds to the third groove of the top portion, and the fourth groove of the work press corresponds to the third ridge of the top portion.

2. The shield box according to claim 1, further comprising a test board disposed on the bottom portion, wherein the socket is mounted on the test board.

3. The shield box according to claim 1, further comprising an absorber positioned around the aperture, wherein the absorber comprises a gasket for absorbing radio-frequency noise, electromagnetic interference noise or shock force.

4. The shield box according to claim 1, further comprising a plurality of side covers covering one or more side surfaces of the top portion and one or more side surfaces of the bottom portion.

5. The shield box according to claim 1, further comprising at least one coaxial adaptor positioned on the bottom portion.

6. The shield box according to claim 5, wherein the bottom portion defines a plurality of through holes, and one or more portions of the coaxial adaptor are disposed in the through holes of the bottom portion.

7. The shield box according to claim 1, wherein the first groove and the first ridge of the top portion and the second groove and the second ridge of the bottom portion surround the socket.

8. The shield box according to claim 1, wherein the first ridge of the top portion is positioned in the second groove of the bottom portion and a size of the first ridge of the top portion fits a size of the second groove of the bottom portion, and the second ridge of the bottom portion is positioned in the first groove of the top portion and a size of the first groove of the top portion fits a size of the second ridge of the bottom portion.

9. The shield box according to claim 1, wherein the top portion further defines an accommodating space for accommodating the socket, and the accommodating space is in communication with the aperture.

10. An apparatus for testing a semiconductor device, comprising:
- a shielding curtain;
- a shield box disposed in a space enclosed by the shielding curtain, and comprising:
  - a top portion defining an aperture and including at least one first ridge and at least one first groove on a lower side of the top portion;
  - a bottom portion including at least one second ridge and at least one second groove, wherein the first ridge of the top portion corresponds to the second groove of the bottom portion, and the first groove of the top portion corresponds to the second ridge of the bottom portion;
  - a test board interposed between the top portion and the bottom portion; and
  - a socket mounted on the test board for receiving the semiconductor device accessible through the aperture of the top portion;
- a work press including at least one protrusion portion corresponding to the aperture;
- a signal source configured to emit a test signal to the semiconductor device; and
- a signal receiver configured to receive a result signal from the semiconductor device,
- wherein the protrusion portion of the work press contacts the socket, and the top portion further includes at least one third ridge and at least one third groove on an upper side of the top portion, the work press further includes at least one fourth ridge and at least one fourth groove, wherein the fourth ridge of the work press corresponds to the third groove of the top portion, and the fourth groove of the work press corresponds to the third ridge of the top portion.

11. The apparatus according to claim 10, wherein the shielding curtain covers one or more side surfaces of the top portion and one or more side surfaces of the bottom portion.

12. The apparatus according to claim 10, further comprising a plurality of side covers covering a plurality of portions of the shielding curtain on the side surfaces of the top portion and the side surfaces of the bottom portion.

13. The apparatus according to claim 10, further comprising an absorber interposed between the fourth ridge of the work press and the third groove of the top portion, wherein the absorber comprises a gasket for absorbing noise or shock force.

14. The apparatus according to claim 13, wherein the absorber is positioned in the third groove of the top portion.

15. The apparatus according to claim 13, wherein the absorber is positioned around the aperture.

16. The apparatus according to claim 13, wherein a thickness of the absorber is less than a depth of the third groove of the top portion.

17. The apparatus according to claim 10, wherein the signal source and the signal receiver are disposed in the space enclosed by the shielding curtain, and are configured to be electrically connected to the semiconductor device.

18. The apparatus according to claim 10, wherein the fourth ridge and the fourth groove surround the aperture.

19. The apparatus according to claim 10, wherein the fourth ridge and the fourth groove surround the socket.

* * * * *